(12) United States Patent
Ngo et al.

(10) Patent No.: US 6,420,752 B1
(45) Date of Patent: Jul. 16, 2002

(54) SEMICONDUCTOR DEVICE WITH SELF-ALIGNED CONTACTS USING A LINER OXIDE LAYER

(75) Inventors: Minh Van Ngo, Fremont; Yu Sun, Saratoga; Fei Wang, San Jose; Mark T. Ramsbey, Sunnyvale; Chi Chang, Redwood City; Angela T. Hui, Fremont; Mark S. Chang, Los Altos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/502,163

(22) Filed: Feb. 11, 2000

(51) Int. Cl.[7] ............................................. H01L 29/788
(52) U.S. Cl. .................. 257/315; 257/314; 365/185.01; 365/185.26
(58) Field of Search ........................... 257/314; 438/201, 438/211, 257; 365/185

(56) References Cited

U.S. PATENT DOCUMENTS

| | | | |
|---|---|---|---|
| 5,553,018 A | 9/1996 | Wang et al. | 365/185.01 |
| 5,776,811 A | 7/1998 | Wang et al. | 438/264 |
| 6,177,304 B1 * | 1/2001 | Li et al. | 438/233 |
| 6,194,784 B1 * | 2/2001 | Parat et al. | 257/774 |

OTHER PUBLICATIONS

U.S. application No. 09/502,628, Wang, filed Feb. 11, 2000.
U.S. application No. 09/502,153, Wang, filed Feb. 11, 2000.
U.S. application No. 09/502,375, Kinoshita, filed Feb.11, 2000.

* cited by examiner

Primary Examiner—David Nelms
Assistant Examiner—Tu-Tu Ho
(74) Attorney, Agent, or Firm—Mikio Ishimaru

(57) ABSTRACT

A semiconductor device for minimizing auto-doping problems is disclosed. An etch stop layer is eliminated and is replaced with a consumable liner oxide layer so that stacked gate structures of the device can be positioned closer together, thus permitting shrinking of the device. The liner oxide layer is formed directly over a substrate and in contact with stacked gate structures, sidewall spacers, and sources and drains formed on the substrate, and serves as an auto-doping barrier for the dielectric layer to prevent boron and phosphorous formed in the dielectric layer from auto-doping into the sources and drains.

7 Claims, 8 Drawing Sheets

SEMICONDUCTOR DEVICE WITH SELF-ALIGNED CONTACTS USING A LINER OXIDE LAYER

CROSS-REFERENCE TO RELATED APPLICATIONS

The present application contains subject matter related to the following concurrently filed U.S. patent application: Ser. No. 09/502,628; 1) by Fei Wang, Yu Sun, Angela T. Hui, Mark S. Chang, Mark T. Ramsbey, Chi Chang, and Ramkumar Subramanian entitled "REDUCED SIZE SEMICONDUCTOR DEVICE AND MANUFACTURING METHOD THEREFOR" and identified by Ser. No. 09/502,628; 2) by Fei Wang, Ramkumar Subramanian, and Yu Sun entitled "METHOD FOR FORMING SELF-ALIGNED CONTACTS USING CONSUMABLE SPACERS" and identified by Ser. No. 09/502,153; now issued as U.S. Pat. No. 6,348,379 and 3) by Hiroyuki Kinoshita, Yu Sun, and Fei Wang entitled "METHOD FOR FORMING DOUBLE OXIDE/NITRIDE SPACERS" and identified by Ser. No. 09/502,375, now abandoned. The related applications are assigned to Advanced Micro Devices, Inc.

TECHNICAL FIELD

The present invention relates generally to semiconductors and more specifically to an improved fabrication process for making semiconductor memory devices.

BACKGROUND ART

In general, memory devices such as a Flash electrically erasable programmable read only memory (EEPROM) are known. EEPROMs are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of substrate overlying the channel region; a polysilicon floating gate overlying the tunnel oxide; an interpoly dielectric overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

A Flash EEPROM also includes peripheral portions which typically include input/output circuitry for selectively addressing individual memory cells.

The process of forming Flash EEPROM cells is well-known and widely practiced throughout the semiconductor industry. After the formation of the memory cells, electrical connections, commonly known as "contacts", must be made to connect the stack gated structure, the source region and the drain regions to other part of the chip. The contact process starts with the formation of sidewall spacers around the stacked gate structures of each memory cell. An etch stop or liner layer, typically a nitride material such silicon nitride, is then formed over the entire substrate, including the stacked gate structure, using conventional techniques, such as chemical vapor deposition (CVD). A dielectric layer, generally of oxide such as such as boro-phospho-tetra-ethyl-ortho silicate (BPTEOS) or borophosphosilicate glass (BPSG), is then deposited over the etch stop layer. A layer of photoresist is then placed over the dielectric layer and is photolithographically processed to form the pattern of contact openings. An anisotropic etch is then used to etch out portions of the dielectric layer to form source and drain contact openings in the oxide layer. The contact openings stop at the source and drain regions in the substrate. The photoresist is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process which removes the conductive material above the dielectric layer to form the conductive contacts through a contact CMP process.

For miniaturization, it is desirable to dispose adjacent word lines as closely together as possible. A problem associated with the use of a nitride layer as an etch stop layer is that the effective separation between adjacent stacked gate structures is reduced. This is becoming critical as separation between adjacent stacked gate structures diminishes.

Another problem associated with the use of a nitride layer as an etch stop layer is that boron and phosphorus in the dielectric layer may diffuse into the source and drain causing auto-doping problem there. It is known that auto-doping in the source and drain adversely affects device performance.

A solution, which would allow further miniaturization of memory device without adversely affecting device performance or yield while prevent boron and phosphorus in the dielectric from diffusing into the source and drain of the device has long been sought, but has eluded those skilled in the art. As the demand for higher performance devices and miniaturization continues at a rapid pace in the field of semiconductor, it is becoming more pressing that a solution be found.

DISCLOSURE OF THE INVENTION

The present invention provides a method for shrinking a semiconductor device by eliminating an etch stop layer so its stacked gate structures can be positioned closer together.

The present invention provides a method for shrinking a semiconductor device by eliminating an etch stop layer and replacing it with a consumable liner layer so its stacked gate structures can be positioned closer together.

The present invention provides a method for forming a dielectric layer over a liner oxide layer, wherein the liner oxide layer (1) is formed directly over a substrate and in contact with stacked gate structures, sidewall spacers, and sources and drains formed on the substrate, and (2) serves as an auto-doping barrier for the dielectric layer to prevent boron and phosphorous formed in the dielectric layer, from auto-doping into the sources and drains.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
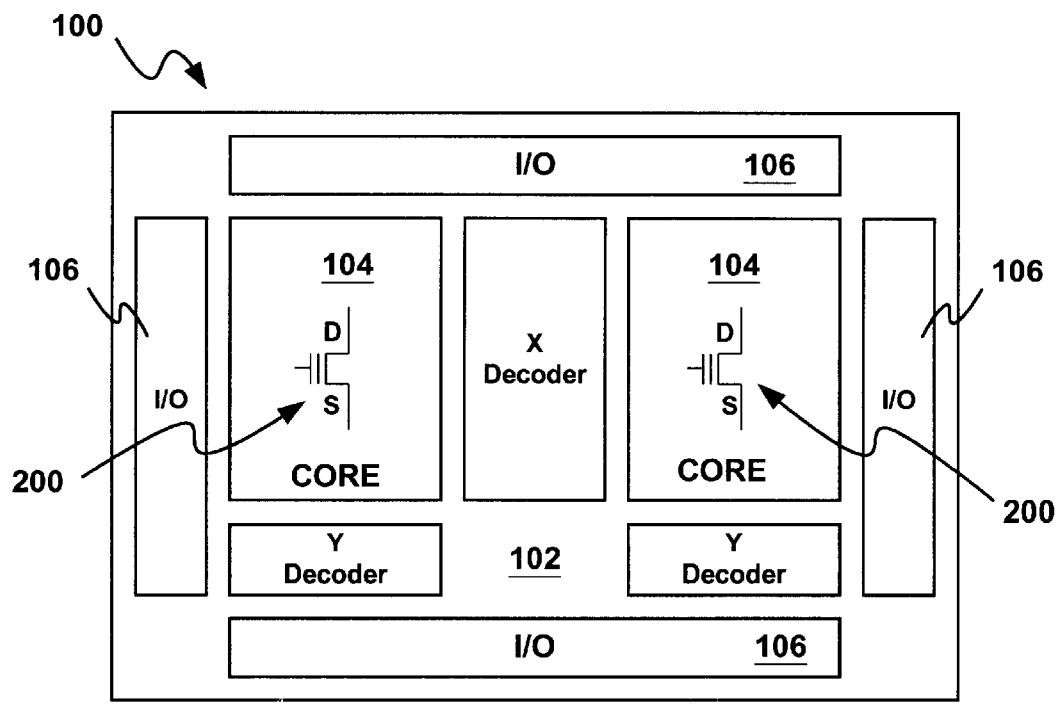
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations.

Figure 2A:
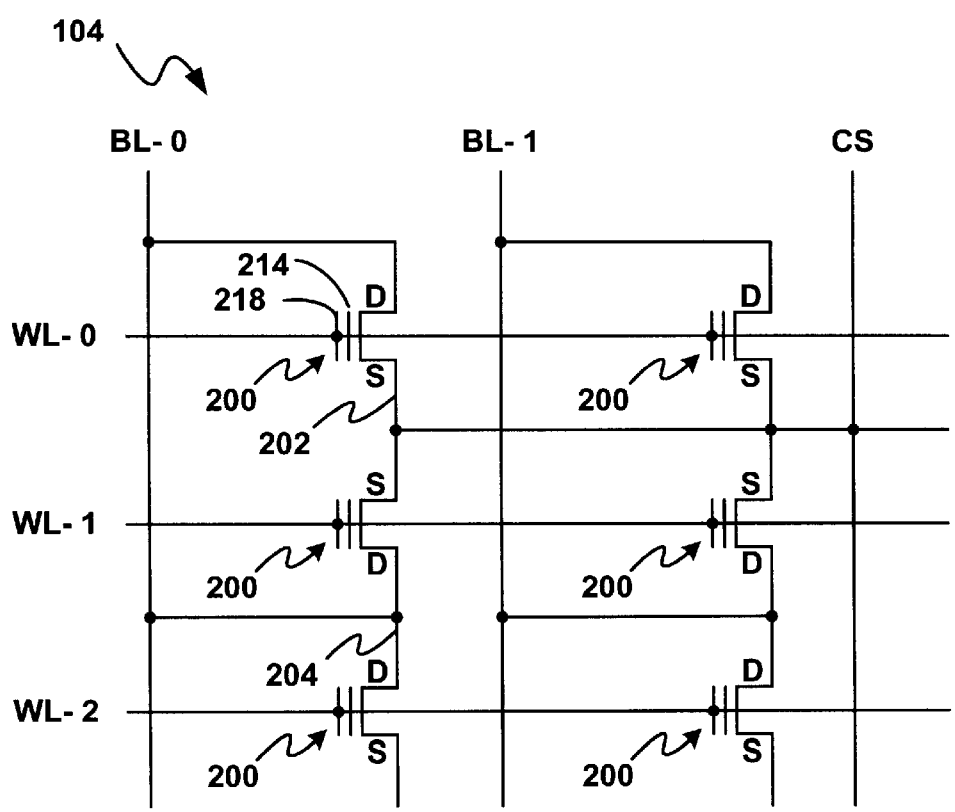
FIG. 2A (PRIOR ART) is a schematic diagram of a portion of a memory cell array.
Figure 2B:
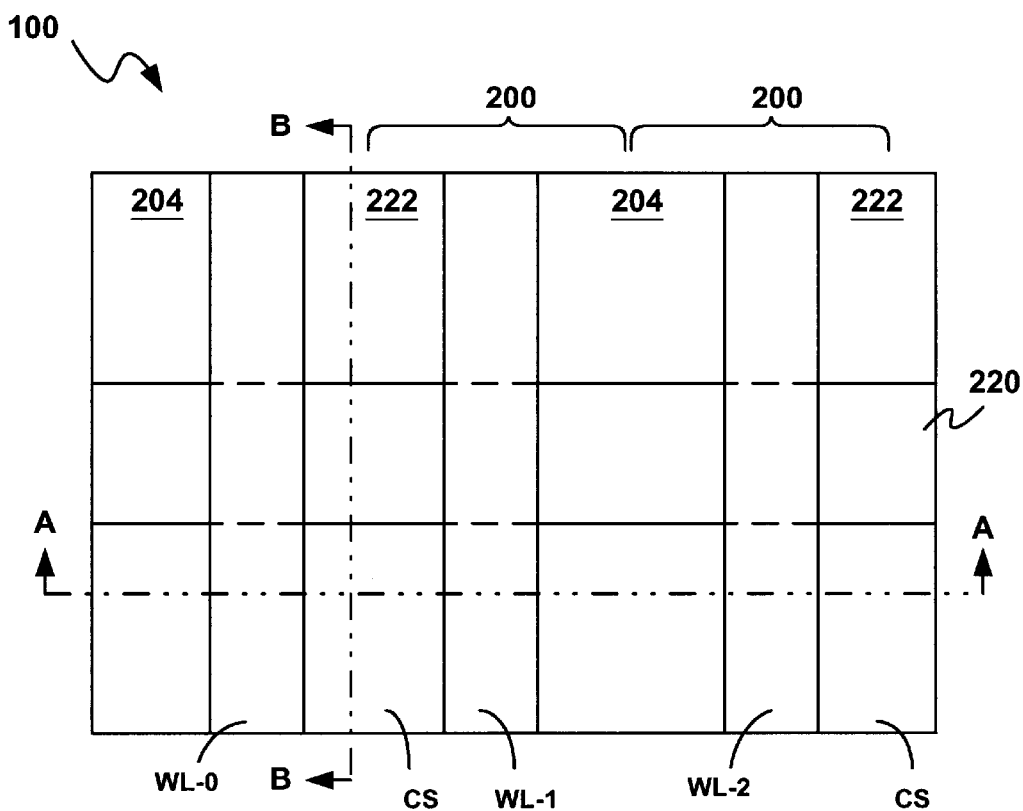
FIG. 2B (PRIOR ART) is a plan view of a portion of an intermediate state (partially complete) of a cell array core.
Figure 2C:
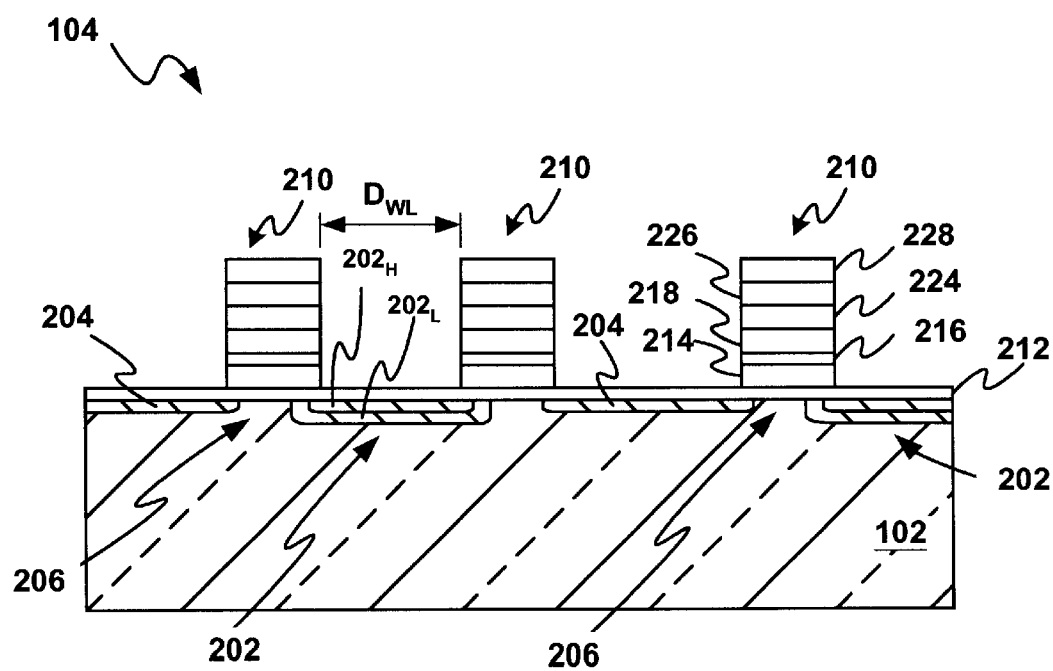
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell 200 in array core 104 typically comprises: a source 202, a drain 204 and a channel 206 (shown in FIG. 2C (PRIOR ART)) semiconductor regions.

Referring now to FIG. 2B (PRIOR ART), therein is shown a plan view of a portion of an intermediate state (partially complete) of a cell array core 104.

Referring now to FIG. 2C (PRIOR ART), therein is shown a simplified cross-section of FIG. 2B (PRIOR ART) along line A—A. The source 202, drain 204, and channel 206 semiconductor regions are shown formed in semiconductor substrate 102 (or in an isolation well); and a multi-layer structure, commonly referred to as a "stacked gate" (word line) structure 210. Stacked gate structure 210 includes: thin gate dielectric layer 212 (commonly referred to as the "tunnel oxide") formed on the surface of semiconductor substrate 102 overlying channel 206; a floating gate 214 overlying the gate dielectric layer 212; an interpoly dielectric 216 overlying floating gate 214; and a control gate 218 overlying interpoly dielectric layer 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. Cells 200 are arranged in a series of rows and columns.

In the completed array, the control gates 218 of the cells 200 in a row are formed integral to a common word line (WL) associated with the row. Columns of cells are arranged such that adjacent cells in a column share a common semiconductor region as a source or drain region. The source 202 of each cell in a column (excepting end cells) is formed in a common region with one of the adjacent cells, e.g., the preceding cell in the column. Likewise, the drain of the cell is formed in a common region with the drain 204 of the other adjacent cell, e.g., the next succeeding cell in the column (except end cells). The drain of each cell in a column of cells is connected by a conductive bit line (BL) (FIG. 2A (PRIOR ART)), including an overlying layer of metal connected to each drain 204 of the cells 200 within the column. Additionally, the sources of each cell 200 in a row (and hence pairs of rows) are interconnected by a common source line CS (FIGS. 2A (PRIOR ART)) formed in the semiconductor substrate 102, as will be described. Any particular cell 200 within the array cores 104 can be individually addressed (programmed and read) by operating upon one word line and one bit line.

Typically, in forming an EEPROM 100, a pattern of field oxide regions 220 (FIG. 2B) is initially formed to provide electrical isolation between the respective devices of EEPROM 100. For example, field oxide regions 220 are used to provide isolation between the array cores 104 and the devices of peripheral portions 106, as well as between the various columns of cells 200 within the array cores 104. Field oxide regions are conventionally formed using a mask and selective growth process: a layer of thermal oxide ("barrier oxide" or "pad oxide") is grown or deposited over the surface of the semiconductor substrate 102; a mask, frequently composed of nitride, is deposited on the barrier oxide, and patterned to cover those regions of the semiconductor substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying semiconductor substrate 102. In general, referring to FIG. 2B (PRIOR ART), within the array cores 104, the selective growth process results in alternating parallel strips of field oxide regions 220 and exposed regions corresponding to the columns of cells 200 in the array.

Stacked gate word line structures 210 are then typically formed. For example, gate dielectric layer 212, suitably comprising a thin (e.g. approximately 100 angstroms) layer of oxide, is initially formed on the semiconductor substrate 102 by a suitable technique, such as, for example, thermally oxidizing the surface of the semiconductor substrate 102 or by depositing a suitable material on the semiconductor substrate 102. A layer of suitable conductive polysilicon (e.g., polycrystalline silicon), that will ultimately form the floating gates 214, is typically then formed on the gate dielectric layer 212. For example, conductive polysilicon may be deposited by any suitable technique, e.g., conventional chemical vapor deposition (CVD). The polysilicon layer is typically then masked and etched to remove strips overlying the field oxide regions 220, leaving isolated strips of polysilicon on top of the gate dielectric layer 212 overlying the substrate regions corresponding to the columns of cells 200 of the array core 104 (i.e. the regions in which source, channel, and drain regions of cells in the column will be formed). A layer of suitable dielectric material, such as, e.g., an oxide-nitride-oxide (ONO) layer, that will ultimately form interpoly dielectric 216 is typically then formed by a suitable technique. For example, where interpoly dielectric 216 is ONO, it is suitably formed by growing a layer of oxide, depositing a layer of nitride, followed by growing another layer of oxide. The interpoly dielectric 216 layer, in the completed array, insulates control gates 218 from floating gates 214 in the individual cells and electrically isolates the adjacent columns of the floating gates 214 in the array core 104. Another layer of conductive polysilicon (e.g., polycrystalline silicon), that will ultimately form the control gates 218 (and the word lines WL connecting the control gates of the cells in the respective rows of the array core 104) is typically then deposited on the interpoly dielectric layer, by a suitable technique, such as, for example, by conventional CVD. Portions of the respective polysilicon and interpoly dielectric layers are typically then selectively removed, to define the stacked gate structures 210 on the gate dielectric layer 212, i.e., to form the floating gates 214, the interpoly dielectric layer 216, and control gates 218 of the individual cells, and the word lines WL (portions of the interpoly dielectric 216 and control gate polysilicon layers, bridge field oxide regions 220, to connect the respective cells of the rows of the core array). This is typically effected by suitable masking and etching techniques.

When completed, this etch creates the respective, generally parallel, word line structures 210 separated by a distance $D_{WL}$, as shown in FIG. 2C (PRIOR ART). A silicide layer 224 is typically provided over the polysilicon layer 218 to reduce resistance. Thereafter, a polysilicon layer (commonly referred to as a "poly cap" layer) 226 is then formed over the silicide layer 224 to serve as a cap layer for the stacked gate structure 210. Next, a silicon oxynitride layer 228 may be formed over the poly cap layer 226. The combination of the poly cap layer 226 and the silicon oxynitride layer 228 are commonly referred to as a "passivation layer". Thereafter, portions of the poly cap layer 226 and the silicon oxynitride layer 228 are selectively removed using conventional masking and etching techniques to define the final stacked gate structure 210.

Conventionally, the portions of the field oxide regions 220 and the gate dielectric layer 212 between every second pair of adjacent word lines 210 in the array core 104 (i.e., the regions, generally indicated as 222, where the sources 202 are to be formed and the portions of the field oxide regions 220 disposed between sources 202 of the corresponding cells of adjacent columns) are then typically removed, in preparation for formation of the common line CS (not shown)) connecting the sources 202. This is typically effected using a conventional Self-Aligned Source (SAS) etch.

Figure 2D:
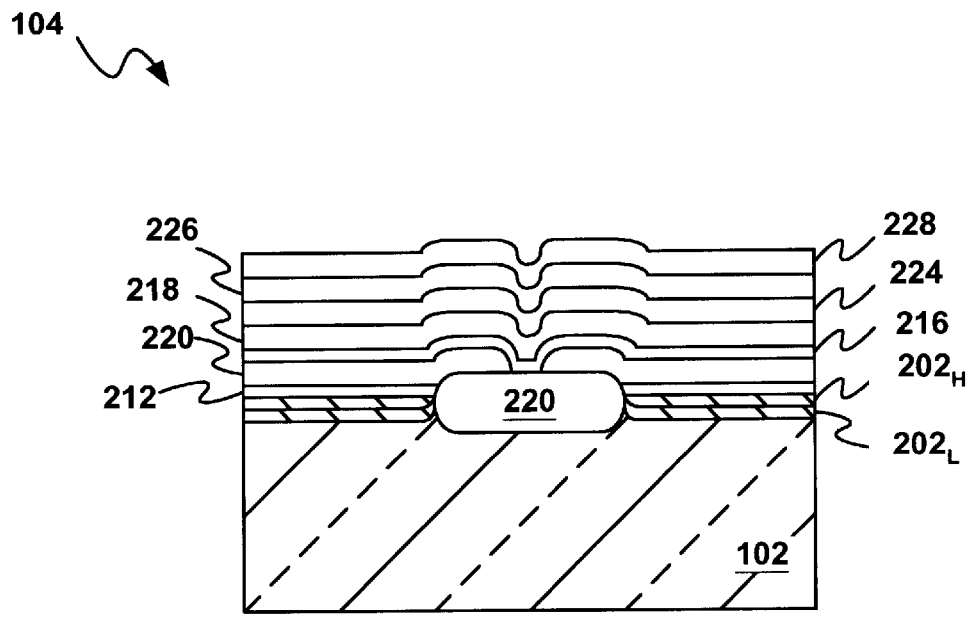
FIG. 2D (PRIOR ART) is a simplified cross section of FIG. 2B (PRIOR ART) along line B—B.

Referring now to FIG. 2D (PRIOR ART), therein are shown a simplified cross section of FIG. 2B (PRIOR ART) along line B—B for purposes of clarity.

In a conventional process, the source 202, common line CS, and drain 204 regions are then formed. The source 202 and the common source line CS are typically formed by initially effecting a conventional double diffusion implant (DDI), with the SAS mask still in place. The DDI implants a first dopant (e.g. n-type, such as phosphorous) to form a deeply diffused, but lightly doped, N well $202_L$ establishing a graded source-channel junction as shown in FIG. 2D (PRIOR ART). The SAS mask is then removed. The DDI implant is typically driven deeper into the substrate 102 by subjecting the substrate 102 to a thermal cycle at high temperature (e.g. 1050 degrees Celsius). A shallow second implant, commonly referred to as a medium diffused drain (MDD) implant, is then performed (e.g., with arsenic) to create a more heavily doped, but shallower, n+well $202_H$ embedded within deep N well $202_L$. The MDD implant also forms a shallow, abrupt drain 204.

Figure 3A:
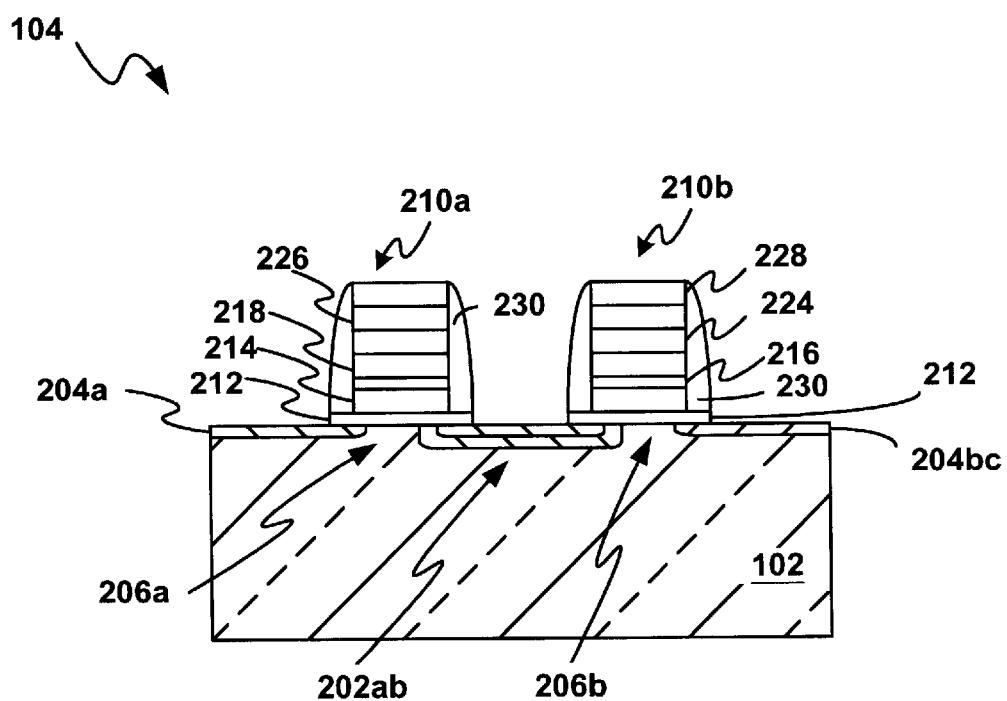
FIG. 3A (PRIOR ART) through 3E (PRIOR ART) illustrate the sequence of process steps of a conventional process for forming source/drain (S/D) contacts in a portion of a cell array core.

Referring now to FIGS. 3A (PRIOR ART) through 3E (PRIOR ART), therein is shown the sequence of process steps of a conventional process for forming source/drain (S/D) contacts in a portion of cell array core 104. FIG. 3A (PRIOR ART) shows the formation of sidewall spacers 230 around the stacked gate structures 210a and 210b formed on semiconductor substrate 102. At this stage are shown a channel region 206a separated by a drain 204a and a common source 202ab, and a channel region 206b separated by the common source 202ab and a common drain 202bc. The sidewall spacers 230 are typically formed of a nitride material using conventional deposition and etching techniques. Alternatively, the sidewall spacers 230 may be formed of an oxide material using chemical vapor deposition (CVD) followed by etching. At this stage the gate dielectric layer 212 in other areas of the substrate 102 is also removed during the etch of the sidewall spacers 230.

Figure 3B:
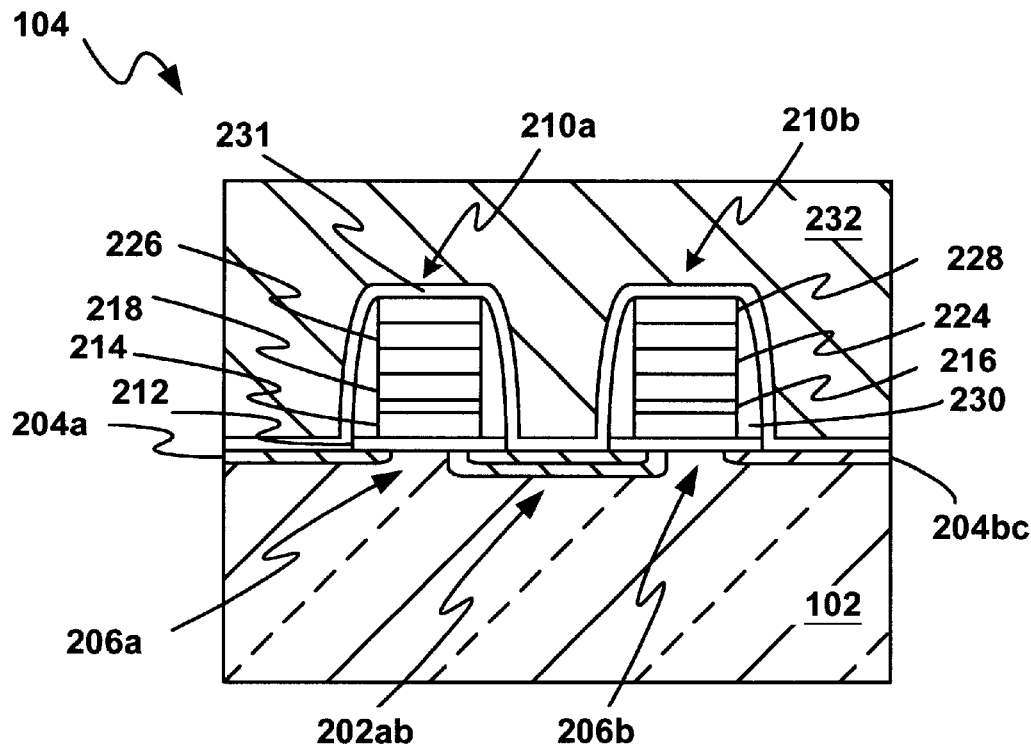

FIG. 3B (PRIOR ART) shows the deposition of an etch stop layer 231 over the entire substrate 102, including over the stacked gate structures 210a and 210b using conventional techniques, such as CVD. The etch stop layer 231 is typically formed of a nitride material such silicon nitride and is formed to a thickness typically in the range of approximately 30 to 120 nm. The etch stop layer 231 reduces the effective spacing between the stacked gate structures 210a and 210b. A dielectric layer 232 is then deposited over the etch stop layer 231. The dielectric layer 232 may include various oxides, such as boro-phospho-tetra-ethyl-ortho silicate (BPTEOS) or borophosphosilicate glass (BPSG), formed using plasma enhanced chemical vapor deposition (PECVD).

Figure 3C:
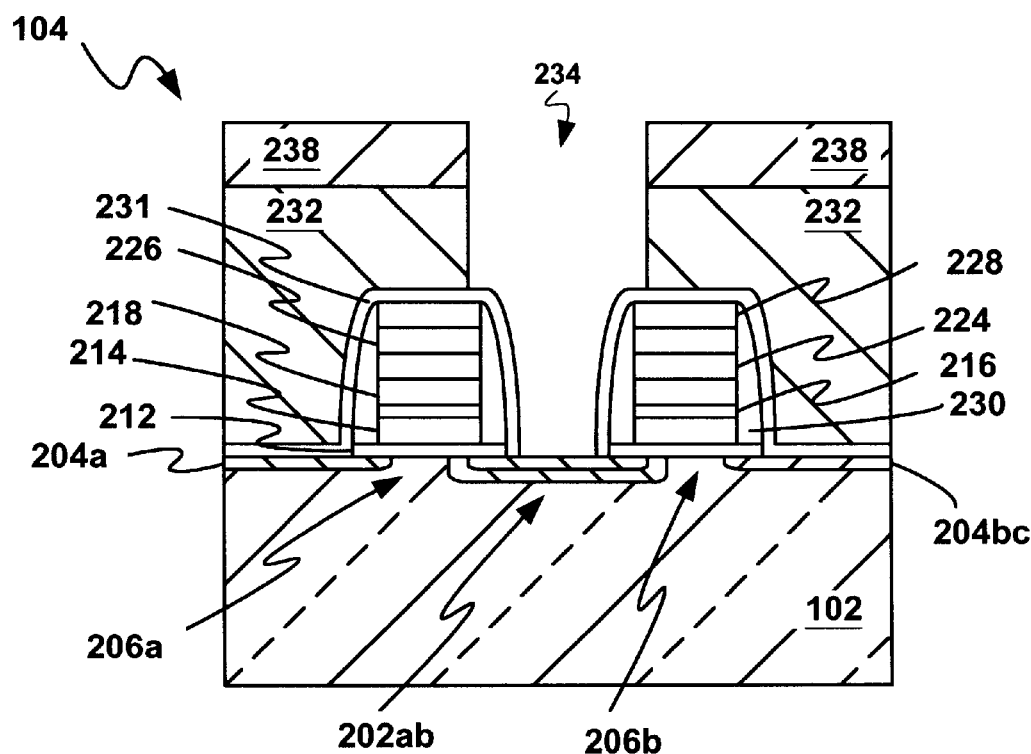

FIG. 3C (PRIOR ART) shows the formation of source/drain (S/D) contact opening 234 in the dielectric layer 232, through etch stop layer 231, using a contact mask 238, to expose portions of the common source 202ab. For simplicity of illustration, only one contact opening 234 is shown. The contact opening 234 is formed conventionally using a two-step etch process. The first etch process is a conventional etch process, such as an oxide etch process, which stops at the etch stop layer 231. The second etch process is a conventional etch process, such as a nitride etch process, which removes portions of the etch stop layer 231 to expose portions of the common source 202ab.

Figure 3D:
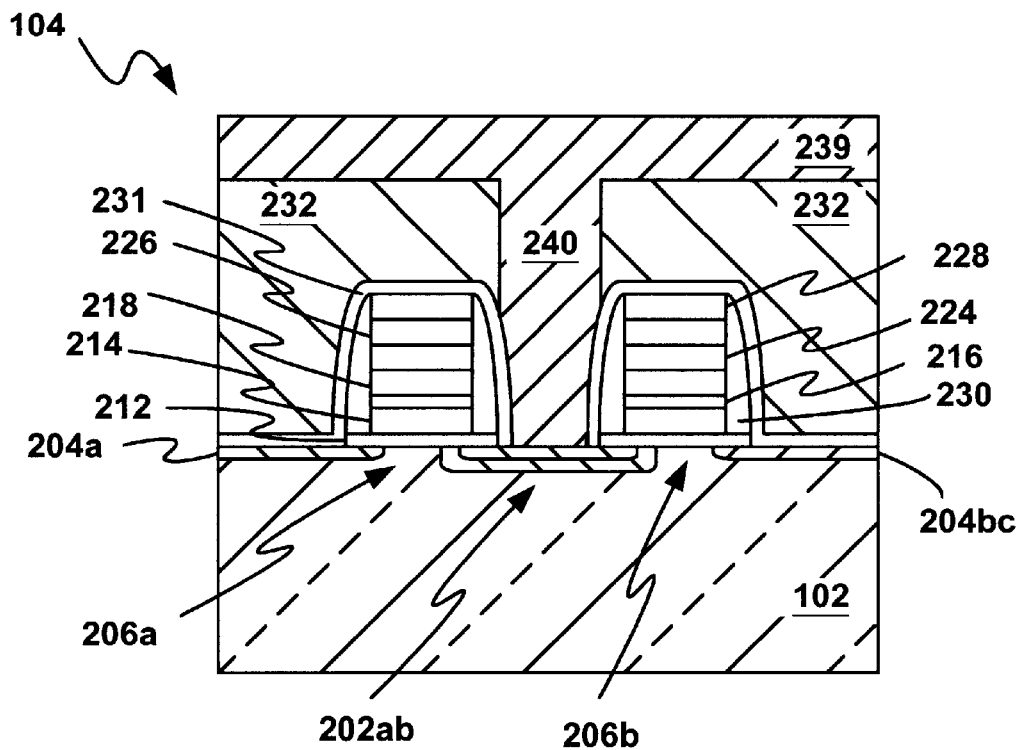

FIG. 3D (PRIOR ART) shows the removal of the contact mask 238 and the deposition of a conductive material to form a conductive layer 239 over the dielectric layer 232. The conductive material fills the contact opening 234 which will form a contact 240. The conductive material typically includes tungsten, aluminum, copper, gold, silver, etc., and may be formed using conventional metal deposition techniques, such as CVD and/or physical vapor deposition (PVD). A barrier material (not shown), such as titanium (Ti)/titanium nitride (TiN), is typically deposited to coat the walls of the contact opening 234 prior to the deposition of the conductive material to ensure good adhesion and electrical contact to the walls of the contact opening 234 and the underlying common source 202ab.

Figure 3E:
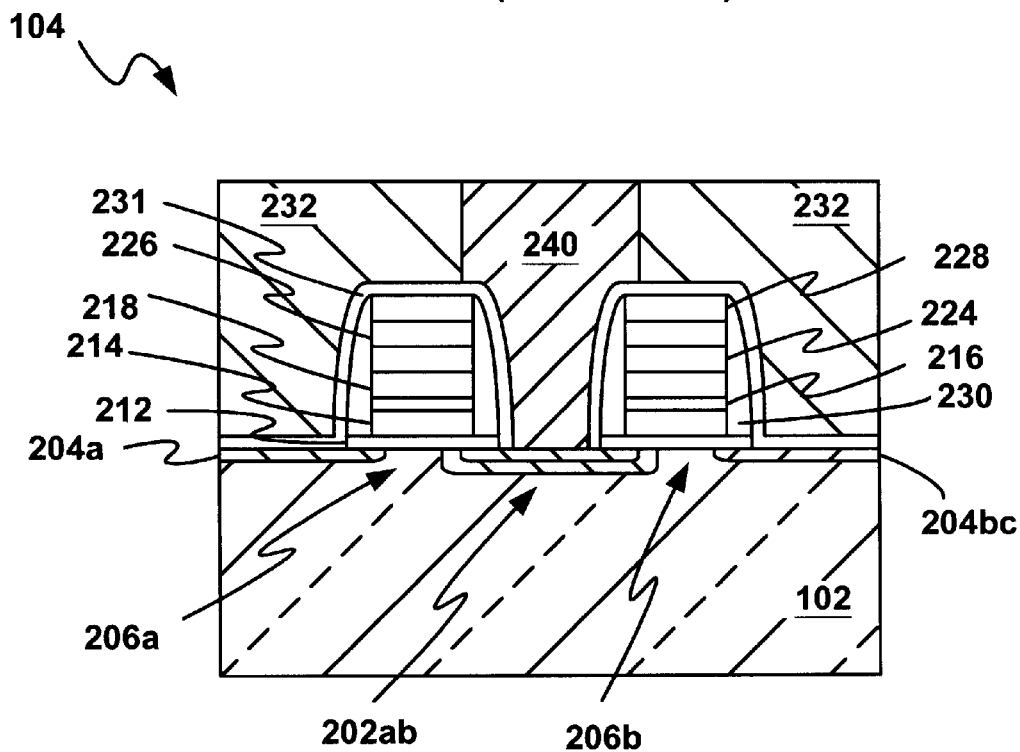

Referring now to FIG. 3E (PRIOR ART), therein is shown the removal of conductive material above the dielectric layer 232 using for example, chemical-mechanical polishing techniques.

As explained in the BACKGROUND ART, one of the problems associated with the use of a nitride layer as an etch stop layer is that the effective separation between adjacent stacked gate structures is reduced. This is becoming critical as separation between adjacent stacked gate structures reduces. The other problem associated with the use of a nitride layer as an etch stop layer is that boron and phosphorus in the dielectric layer may diffuse into the source and drain causing auto-doping problem there. It is known that auto-doping in the source and drain adversely affects device performance. The present invention provides a method for shrinking a semiconductor device by eliminating the etch stop layer so its stacked gate structures can be positioned closer together. The present invention also provides a method for preventing boron and phosphorous diffusion from the dielectric layer into source and drain and thus minimizes the auto-doping problem associated with the conventional process.

Referring now to FIGS. 4A through 4E, therein is shown the sequence of process steps for forming contact plugs in accordance with the present invention for fabricating EEPROM device on a semiconductor substrate. For convenience of illustration, like reference numerals are used in FIG.4A through 4G to denote like elements already described in FIGS. 1 (PRIOR ART), 2A (PRIOR ART) through 2D (PRIOR ART), and 3A (PRIOR ART) through 3E (PRIOR ART).

Figure 4A:
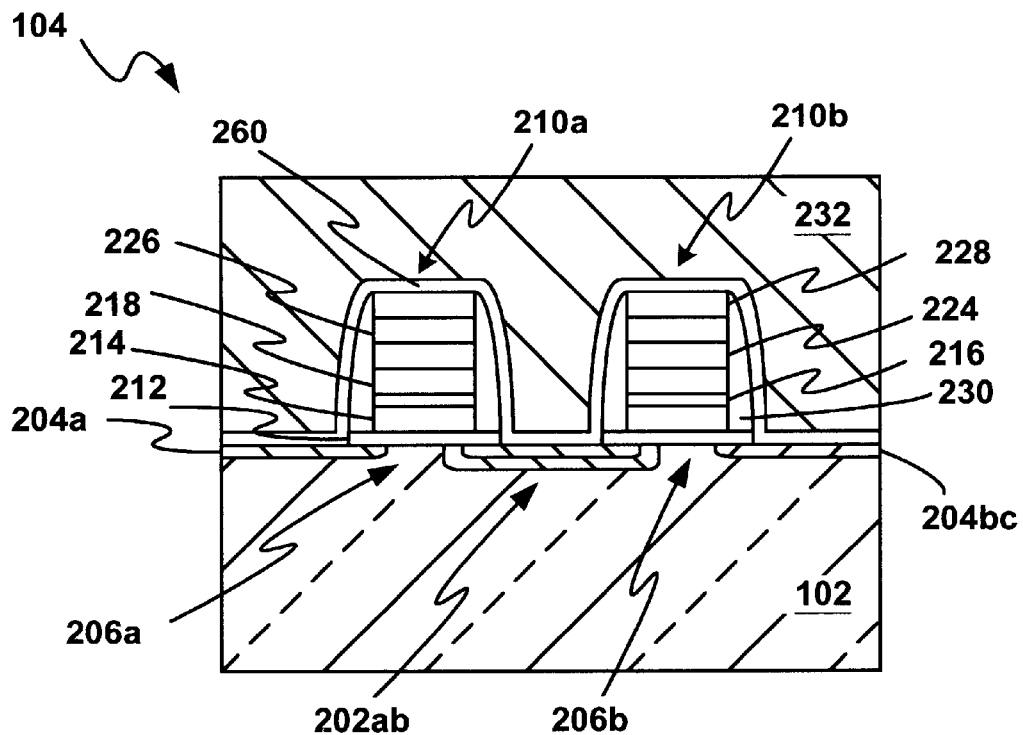
FIGS. 4A through 4E illustrate the sequence of process steps of a process in accordance with the present invention for forming source/drain (S/D) contacts in a portion of a cell array core.

FIG. 4A shows a partial, sectional view of an intermediate state (partially complete) of a portion of a cell array core 104, similar to what was shown in FIG. 3B. At this stage is shown a pair of stacked gate structures 210a and 210b formed on a semiconductor substrate 102. A common source 202ab is formed between the two stacked gate structures 210a and 210b. Drains 204a and 204bc are formed on the semiconductor substrate 102 and are spaced apart from the common source 202ab by channel regions 206a and 206b, respectively. Sidewall spacers 230 are formed around the stacked gate structures 210a and 210b. The sidewall spacers 230 may be formed of an oxide or nitride material using conventional deposition and etching techniques. In this embodiment, sidewall spacers 230 are formed of a nitride material such as silicon nitride. The gate dielectric layer 212 will be etched away during the etching of the sidewall spacers 230 except under the stack gate structures 210a and 210b. After the sidewall spacers 230 are formed, a liner oxide layer 260 is formed over the entire semiconductor substrate 102, including the stacked gate structures 210a and 210b, sidewall spacers 230, common source 202ab, and drains 204a and 204bc. The liner oxide layer 260 is in contact with the stacked gate structures 210a and 210b, sidewall spacers 230, common source 202ab, and drains 204a and 204bc. The liner oxide layer 260 may be formed of a material such as silicon dioxide. In a preferred embodiment, liner oxide layer 260 does not include boron or phosphorus. The liner oxide layer 260 is preferably formed to a thickness of between about 30 nm to about 120 nm. The deposition of the liner oxide layer 260 is followed by the deposition of a dielectric layer 232 over and in contact with the liner oxide layer 260. The dielectric layer 232 may include an oxide which contains boron and/or phosphorus, such as boro-phospho-tetra-ethyl-ortho silicate (BPTEOS) or borophosphosilicate glass (BPSG), formed using plasma enhanced chemical vapor deposition (PECVD). The liner oxide layer 260 serves as an auto-doped barrier for the dielectric layer 232 to prevent boron or phosphorus formed therein from auto-doping into common source 202ab and drains 204a and 204bc which may cause degradation in device performance. Specifically, boron and phosphorus may enter into the substrate 102 and cause short circuits between Flash memory cells.

In this embodiment, each of the stacked gate structures 210a (or 210b) includes a gate dielectric layer 212, such as an oxide layer, a floating gate 214 disposed on the gate dielectric layer 212, an interpoly (inter-gate) dielectric layer 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Figure 4B:
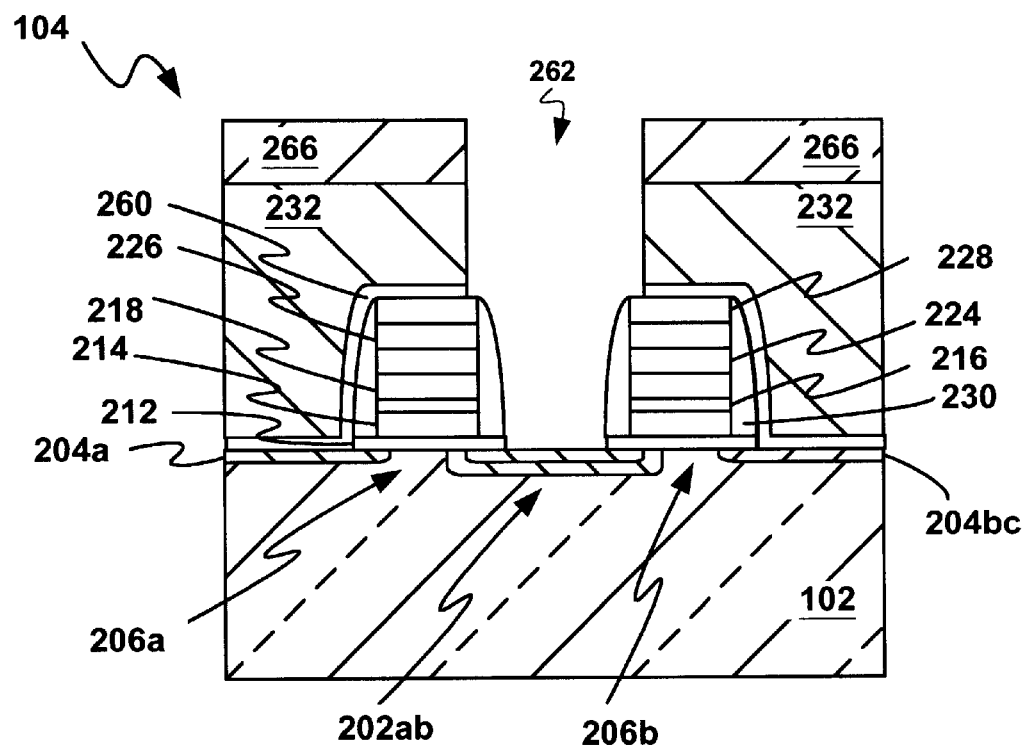

FIG. 4B shows the formation of source/drain (S/D) contact opening 262 in the dielectric layer 232 using a contact mask 266 to expose portions of the common source 202ab. For simplicity of illustration, only one contact opening 262 is shown. To minimize etching of the sidewall spacers 230 and the underlying substrate 102, contact opening 262 is formed using an oxide etch process with a sufficiently high selectivity, i.e., etching of the dielectric layer 232 is performed with reactive ions at a rate faster than the etch rate of the sidewall spacers and the underlying substrate 102. During the oxide etch process, the silicon oxynitride layers 228 act as protective layers for the stack gate structures 210a and 210b to avoid it from being etched. It should be noted that the liner oxide layer 260 located above the common source 202ab and portions of the liner oxide layer 260 on the sidewall spacers 230 are removed during this etch process.

Figure 4C:
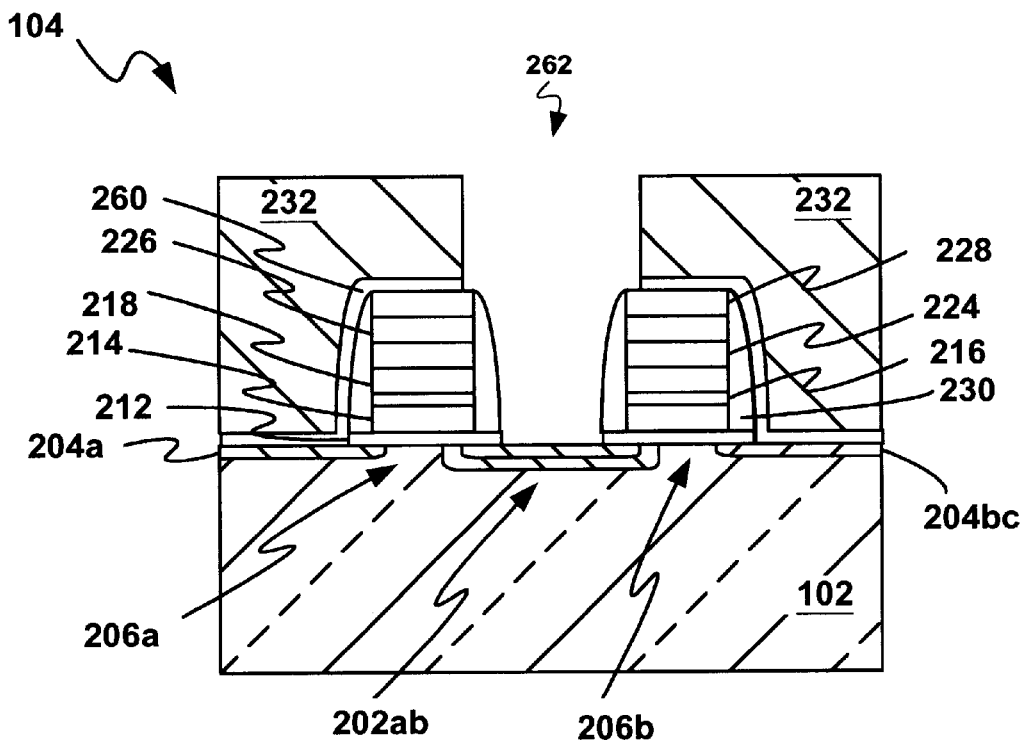

FIG. 4C shows the removal of the contact mask 266.

Figure 4D:
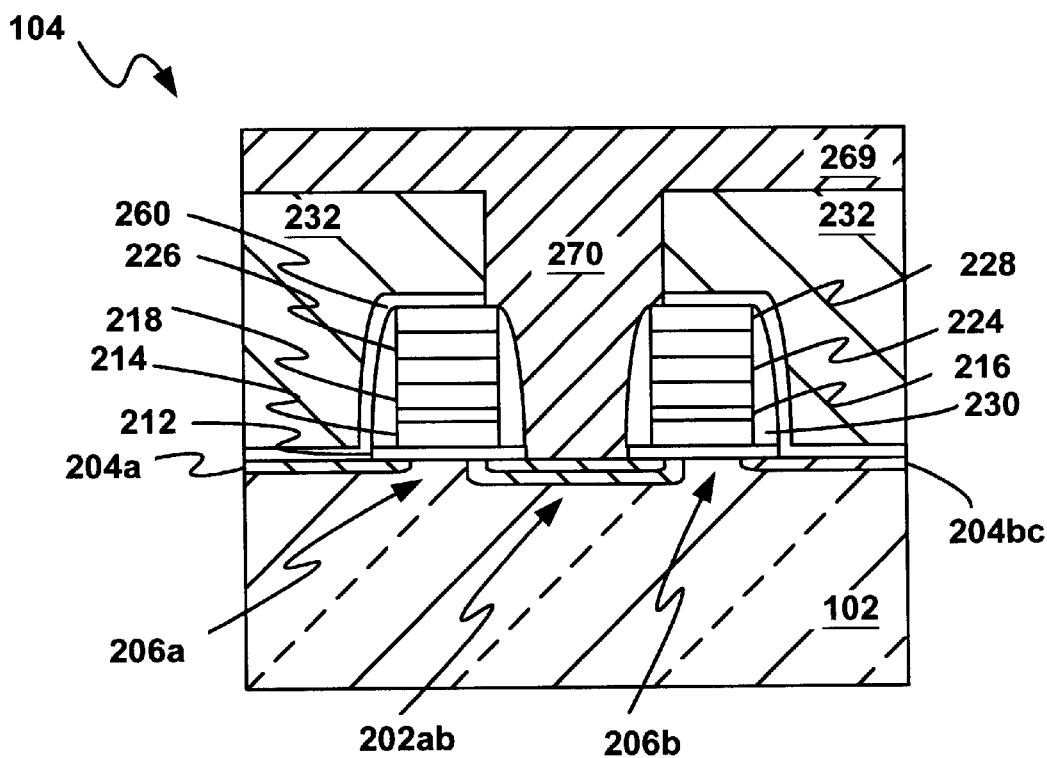

FIG. 4D shows the deposition of a conductive material to form a conductive layer 269 over the dielectric layer 232. The conductive material fills the contact opening 262 which will form a contact 270. In this embodiment, the conductive material is tungsten and may be formed using conventional metal deposition techniques, such as CVD and/or physical vapor deposition (PVD). Other conductive materials can be used. A barrier material (not shown), such as titanium (Ti)/titanium nitride (TiN), is typically deposited to coat the walls of the contact opening 262 prior to the deposition of the conductive material to ensure good adhesion and electrical contact to the walls of the contact opening 262 and the underlying common source 202ab.

Figure 4E:
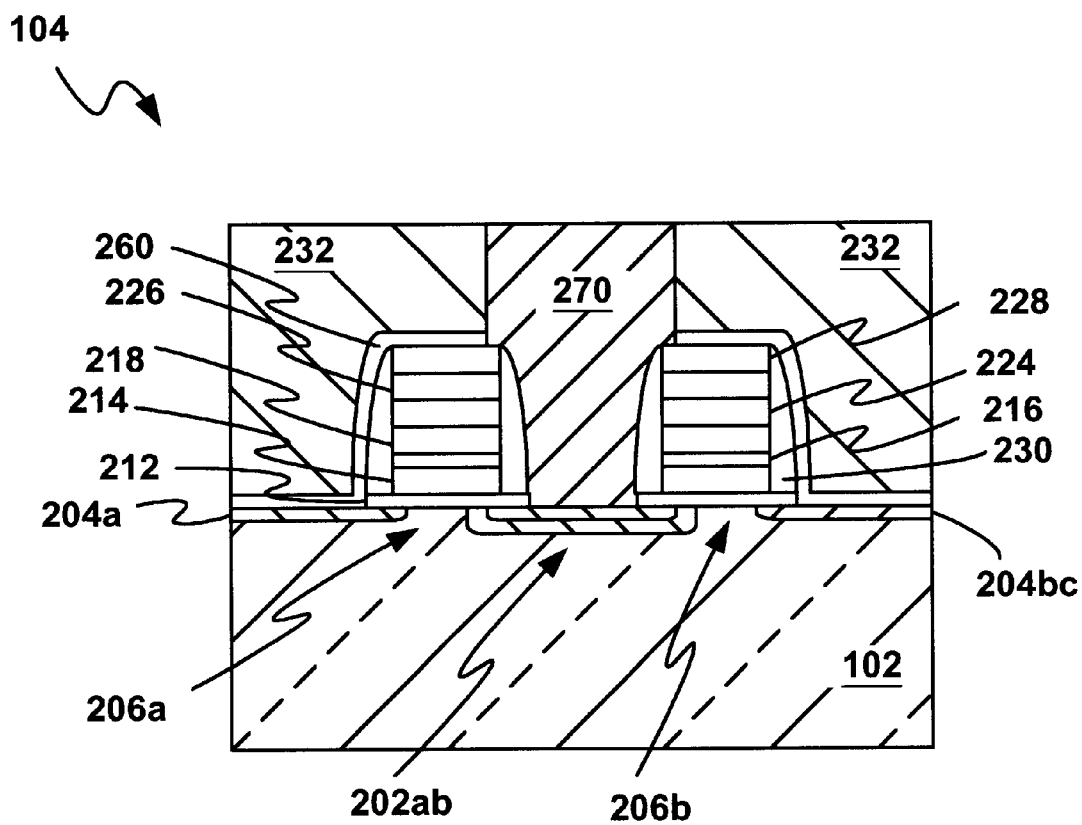

FIG. 4E shows the removal and planarization of the tungsten material above the oxide layer 232 using for example, tungsten chemical-mechanical polishing technique. The tungsten material is planarized until it is smooth with the top surface of the dielectric layer 232.

Therefore, by eliminating the use of an etch stop layer between the dielectric layer 232 and the stacked gate structures 210a and 210b, sidewall spacers 230, and common source 202ab and drain 204a and 240bc, and replacing it with a consumable liner oxide layer 260 in accordance with the present invention, the effective spacing between adjacent stacked gate structures 210a and 210b can be maintained. Further, since the liner oxide layer 260 does not include boron or phosphorus, it serves as an auto-doped barrier to prevent boron or phosphorus formed in the dielectric layer 232 from auto-doping into source 202 and drain 204, causing potential short circuits between Flash memory cells. Thus degradation in device performance due to auto-doping can be minimized. Finally, the liner oxide layer 260 may be used to form second sidewall spacers that may be required in devices formed in the peripheral portions 106. This can be accomplished by the deposition of the liner oxide layer 260 over the entire substrate 102, masking the core portions 104, and then isotropically etching the liner oxide layer 260 in the peripheral portions 106 to form second sidewall spacers around stacked gate structures 210 in peripheral portions 106.

In production, a plurality of stacked gate structures is formed on a semiconductor substrate 102 using conventional techniques as shown in FIG. 4A. For simplicity of illustration, only two stacked gate structures, 210a and 210b, are shown. A common source 202ab is formed between the two stacked gate structures 210a and 210b. Drains 204a and 204bc are formed on the semiconductor substrate 102 and are spaced apart from the common source 202ab by channel regions 206a and 206b, respectively. Sidewall spacers 230 are formed around the stacked gate structures 210a and 210b. The sidewall spacers 230 are formed using conventional deposition and etching techniques. Except for the gate dielectric layer 212 that is located directly underneath the stack gates 210a and 210b and the sidewall spacers, the gate dielectric layer 212 in other areas of the substrate 102 is then removed.

In this embodiment, each of the stacked gate structures (210a or 210b) includes gate dielectric layer 212, a floating gate 214 disposed on the gate dielectric layer 212, an interpoly (inter-gate) dielectric layer 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Next, a liner oxide layer 260 is formed over the entire semiconductor substrate 102, including the stacked gate structures 210a and 210b, sidewall spacers 230, common source 202ab, and drains 204a and 204bc, using high temperature oxidation or plasma enhanced chemical vapor deposition (PECVD) (FIG. 4A). The liner oxide layer 260 is deposited to a thickness of between about 30 nm to about 120 nm and does not include boron or phosphorus. The deposition of the liner oxide layer 260 is followed by the deposition of a dielectric layer 232 over and in contact with the liner oxide layer 260. In one embodiment, the dielectric layer 232 includes boro-phospho-tetra-ethyl-ortho silicate (BPTEOS) or borophosphosilicate glass (BPSG), formed using plasma enhanced chemical vapor deposition (PECVD). The liner oxide layer 260 serves as an auto-doped barrier for the oxide layer 232 to prevent boron or phosphorus formed therein from auto-doped into source 202 and drain 204 which may cause degradation in device performance.

Next, source/drain (S/D) contact opening 262 is formed in the dielectric layer 232 using a contact mask 266 as a mask to expose portions of the common source 202ab, as shown in FIG. 4B. The contact mask 266 is typically formed of a photoresist material. As explained above, an oxide etch process with high selectivity is used to form the contact opening 262 to minimize etching of the sidewall spacers 230 and the underlying substrate 102. It should be noted that the liner oxide layer 260 located above the common source 202ab and portions of the liner oxide layer 260 on the sidewall spacers 230 are removed during this etch process.

Thereafter the contact mask 266 is removed using a conventional photoresist stripping technique (FIG. 4C).

After the removal of the contact mask 266, a conductive material is deposited over the dielectric layer 232 to form a conductive layer 239. The conductive material fills the contact opening 262, which will form a contact 270, as shown in FIG. 4D. In one embodiment, the conductive material is tungsten and is formed using conventional metal deposition techniques.

After the formation of tungsten contact 270, tungsten material above the dielectric layer 232 is removed using for example, tungsten chemical-mechanical polishing, as shown in FIG. 4E.

Therefore, the present invention provides a method for shrinking a semiconductor device and minimizing autodoping problem. By eliminating an etch stop layer and replacing it with a consumable liner oxide layer 260, the stacked gate structures 210 can be positioned closer together which permits the shrinking of the semiconductor device. In addition, the elimination of the etch stop layer removal process desirably reduces process complexity, and increases throughput and yield. Further, since the liner oxide layer 260 does not include boron or phosphorus, it serves as an auto-doped barrier to prevent boron or phosphorus formed in the dielectric layer 232 from auto-doping into source 202 and drain 204, causing potential short circuits between Flash memory cells. Thus degradation in device performance due to auto-doping can be minimized. Finally, the liner oxide layer 260 may be used to form second sidewall spacers that may be required in devices formed in the peripheral portions 106.

While the best mode utilizes tungsten as the conductive material for filling contact openings, it should be understood that the present invention is applicable to other materials selected from a group consisting of tantalum, titanium, copper, aluminum, gold, silver, alloys thereof, polysilicon, and compounds thereof.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A semiconductor device comprising:
   a semiconductor substrate;
   a multi-layer structure disposed on an active region on said semiconductor substrate, said multi-layer structure having a top passivation layer and sidewalls;
   a sidewall spacer disposed over said sidewalls and around said multi-layer structure;
   a source region and a drain region disposed on said active region adjacent said sidewall spacer;
   a liner oxide layer over said semiconductor substrate, including said multi-layer structure, said source region and said drain region, in contact with said sidewall spacer, said source region and said drain region, wherein boron and phosphorus are absent from said liner oxide layer;
   a dielectric layer disposed over said liner oxide layer, wherein said dielectric layer includes a material selected from a group consisting of boron, phosphorus, and a combination thereof; and
   a contact extending through the dielectric layer and the liner oxide layer in contact with the top passivation layer and the sidewall spacers.

2. The semiconductor device as claimed in claim 1 wherein said multi-layer structure comprises a dielectric layer, a floating gate disposed on said dielectric layer, an inter-gate dielectric disposed on said floating gate, a control gate disposed on said inter-gate dielectric, and a silicide layer disposed on said control gate.

3. The semiconductor device as claimed in claim 1 wherein said liner oxide layer comprises silicon dioxide.

4. The semiconductor device as claimed in claim 1 wherein said dielectric layer includes boro-phospho-tetra-ethyl-ortho silicate (BPTEOS).

5. The semiconductor device as claimed in claim 1 wherein said top passivation layer is a material selected from a group consisting of silicon nitride and silicon oxynitride.

6. The semiconductor device a claimed in claim 1 wherein said sidewall spacer comprises silicon nitride.

7. The semiconductor device as claimed in claim 1 wherein said liner oxide layer is formed to a thickness of between about 30 nm to about 120 nm.

* * * * *